(12) United States Patent
Ishii et al.

(10) Patent No.: US 6,389,672 B1
(45) Date of Patent: May 21, 2002

(54) COMPONENT ASSEMBLING METHOD AND COMPONENT ASSEMBLING APPARATUS

(75) Inventors: Yoshimichi Ishii, Neyagawa; Hiroyuki Mochizuki, Katano, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/180,231

(22) PCT Filed: May 7, 1997

(86) PCT No.: PCT/JP97/01525

§ 371 Date: Nov. 3, 1998

§ 102(e) Date: Nov. 3, 1998

(87) PCT Pub. No.: WO97/43891

PCT Pub. Date: Nov. 20, 1997

(30) Foreign Application Priority Data

May 10, 1996 (JP) ............................................. 8-116730
May 10, 1996 (JP) ............................................. 8-116731

(51) Int. Cl.⁷ ................................................ B23P 11/00
(52) U.S. Cl. .......................... 29/430; 29/742; 29/759; 29/822; 206/713; 206/714
(58) Field of Search ...................... 29/430, 742, 783, 29/791, 784, 799, 822, 740, 759, 832, 840; 198/803.14; 206/713, 714, 717; 53/282

(56) References Cited

U.S. PATENT DOCUMENTS

| 3,608,711 | A | * | 9/1971 | Wiesler et al. ................. 206/56 |
| 3,695,414 | A | * | 10/1972 | Wiesler et al. ................. 242/528 |
| 4,298,120 | A | * | 11/1981 | Kaneko et al. ............... 206/714 |
| 4,354,337 | A | * | 10/1982 | Mori et al. .................... 53/559 |
| 4,575,995 | A | * | 3/1986 | Tabuchi et al. ................ 53/591 |
| 4,733,778 | A | * | 3/1988 | Boeckmann et al. ........ 206/332 |
| 4,805,771 | A | * | 2/1989 | Hein ........................... 206/526 |
| 4,842,135 | A | * | 6/1989 | Borst et al. .................. 206/328 |
| 4,844,258 | A | * | 7/1989 | Boeckmann et al. ........ 206/328 |
| 4,898,275 | A | * | 2/1990 | Skrtic et al. ................. 206/526 |
| 4,921,102 | A | * | 5/1990 | Van Erden ................... 206/470 |
| 4,958,053 | A | * | 9/1990 | Boeckmann et al. ........ 206/330 |
| 5,005,275 | A | * | 4/1991 | Borst et al. .................... 29/235 |
| 5,199,564 | A | * | 4/1993 | Skrtic ......................... 206/714 |
| 5,208,976 | A | * | 5/1993 | Bess et al. ..................... 29/740 |
| 5,360,110 | A | * | 11/1994 | Hirai et al. .................. 206/714 |
| 5,389,191 | A | * | 2/1995 | Muramatsu et al. ......... 156/510 |
| 5,427,641 | A | * | 6/1995 | Muramatsu et al. ......... 156/252 |
| 5,524,765 | A | * | 6/1996 | Gutentag ..................... 206/713 |
| 5,557,834 | A | * | 9/1996 | Miyanaka et al. ........ 29/407.05 |
| 5,682,731 | A | * | 11/1997 | Althouse ...................... 53/471 |
| 5,729,963 | A | * | 3/1998 | Bird ............................. 53/471 |
| 5,765,692 | A | * | 6/1998 | Schenz ........................ 206/713 |
| 5,960,961 | A | * | 10/1999 | Gutentag ..................... 206/714 |
| 6,314,876 | B1 | * | 11/2001 | Ackley ......................... 101/44 |

* cited by examiner

Primary Examiner—S. Thomas Hughes
Assistant Examiner—Essama Omgba
(74) Attorney, Agent, or Firm—Price and Gess

(57) ABSTRACT

Components (62–65) are consecutively taken out from a plurality of component feeders (52) which supply a multiplicity of components to a component feeding position (52a) in succession, transferred to a prescribed assembling position (54a, 154a, 157a), and assembled into a product (61), which is then transferred to and held in each of a multiplicity of holding recesses provided in a product storing means (53, 153). This method allows the components to be assembled into a product by a component assembling apparatus of compact and simple construction, as well as permits the assembled product to be held and carried in the holding recesses of the product storing means to the next step of the process.

19 Claims, 13 Drawing Sheets

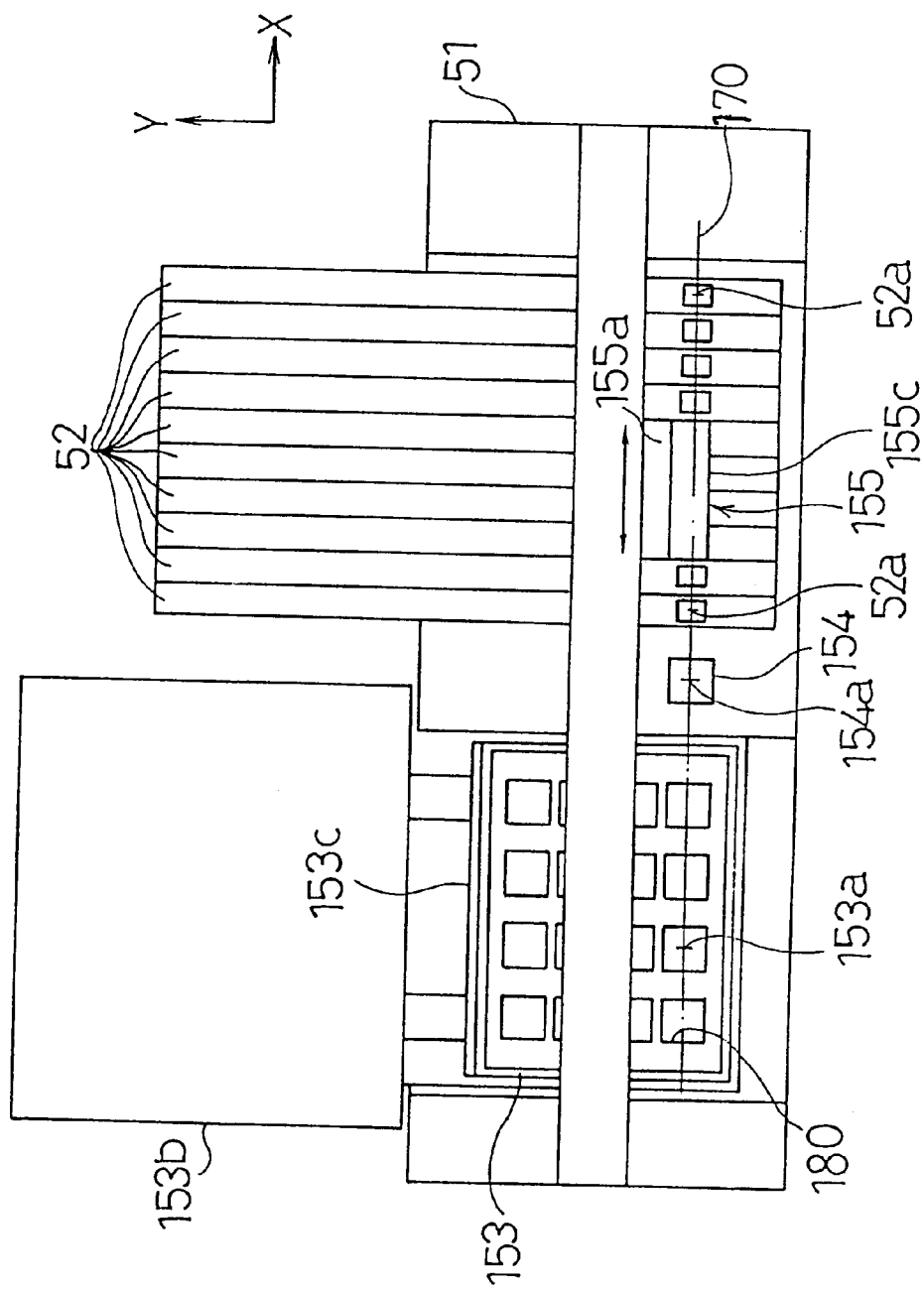

COMPONENT ASSEMBLING METHOD AND COMPONENT ASSEMBLING APPARATUS

TECHNICAL FIELD

The present invention relates to a method of and an apparatus for assembling various components to make an assembled product in an automatic procedure with a tape member.

BACKGROUND ART

A conventional component assembling apparatus includes a plurality of assembling stations aligned along an assembly line which comprises a conveyor(s) equipped with multiple assembling jigs. Each assembling station comprises assembly robots for supplying and mounting components in the assembling jigs and component feeders for feeding components to the assembly robots. Assembled products are transferred by robots from the assembling jigs to a holder or a receiver provided on a tray or a tape-like member which is in turn conveyed to a succeeding step of the assembly line.

However, such conventional component assembling apparatus is bulky and elaborate in construction as it uses a full-scale assembly line with conveyors, and thus causes increase in the cost of installation. Also, there is an extra step required for conveying the assembled products on the assembly line to the tape-like member. This, added with the process of feeding the assembled products to a next step, increases the number of assembling steps and the overall cost of the assembling process.

In view of the foregoing, it is an object of the present invention to provide a method and apparatus for assembling components by which a product can be assembled with a simple construction and the cost of assembling process can be reduced.

DISCLOSURE OF INVENTION

The method of assembling components according to a first feature of the present invention is characterized in that a tape-like member having a multiplicity of holding recesses which are capable of holding assembled products therein is used as an assembling medium as well as a feeding medium of a product, since a component is fed into each of the holding recesses of the tape-like member and assembled into the product within each of the holding recesses, by which the structure of the assembling apparatus is simplified and the number of assembling steps is reduced, thereby decreasing the overall cost of the assembling process.

In the first feature of the invention, if a base component of the product is loaded in the holding recess of the tape-like member in advance, the tape-like member can also serve as the component feeding means, by which the construction of the component assembling apparatus can be made even simpler.

Further, by feeding various components into each of the plurality of holding recesses at their respective stopping position while moving the tape-like member intermittently and assembling them into a product, the product can be assembled in succession as the tape-like member moves, as well as the step of feeding and assembling each component can be simplified, whereby a product can be assembled efficiently with a simple structure.

The component assembling apparatus according to a second feature of the present invention comprises a tape-like member provided with a multiplicity of holding recesses which are capable of holding assembled products therein; a tape conveying means for intermittently transferring the tape-like member along a predetermined conveying path; and a plurality of component feeding and assembling means for supplying a set of components into each of the holding recesses at a stopping position of the holding recesses along the conveying path and for assembling the components into the product within each of the holding recesses, by which the above method of assembling the components is implemented.

When carrying out the method, if the component feeding and assembling means is constructed with a component transferring and assembling means and a component feeder, the component transferring and assembling means can be arranged to be movable in two axes with a simple structure, and any of conventional component feeding means can be employed, hence reducing the cost. Also, if the component feeder is comprised of a tape-like component feeding means which takes out a component from a tape-like component carrying assembly in which a multiplicity of components are accommodated, the components to be assembled can be supplied by the tape-like member, and the assembled products can be fed to the next step as held on the tape-like member, by which the standardization and unity of the assembling process becomes possible and an even simpler assembling step can be realized.

Further, by providing a construction such that a given one of the component feeding and assembling means is provided with a plurality of detachable component feeders in such a way that the component transferring and assembling means can take out a component selectively from any of the component feeders for feeding, even when one of the component feeders runs out of components, the component can be fed from the other component feeders without stopping and thus continuously performing the assembling operation, and continuous production is made possible by exchanging the component feeder which has run out of components. In this case, the component feeding and assembling means can be simply constituted by constructing it with a single component transferring and assembling means, a plurality of component feeders, and a switching means, whereby the position of each of the component feeders is switched over so that the component can be fed from any given one of the component feeders to the single component transferring and assembling means.

The method of assembling components according to a third feature of the present invention comprises the steps of: taking out a component successively from a plurality of component feeders which supply a multiplicity of components to a component feeding position in succession; transferring the component successively to a predetermined assembling position where the component is assembled into a product; and transferring the assembled product into each of a multiplicity of holding recesses provided in a product storing means to be held therein. Alternatively, the component is taken out and transferred consecutively into each of a multiplicity of holding recesses formed in the product storing means, each holding recess being positioned at an assembling position, and the assembled product is kept to be held in the holding recess. Since the component is fed by the component feeder to the component feeding position, the transferring and assembling robot may be provided in singular, by which a product can be assembled efficiently with a compact structure, as well as the product can be fed to the next step in a state held in the holding recess of the product storing means.

In the third feature of the invention, if the component feeding position of all the component feeders, the assembling position, and product receiving position at the holding recesses of the product storing means are all aligned in one straight line, so that the components and the products are transferred along only one axis between each of these positions, or if the component feeding position of the component feeders and the assembling position at the holding recesses of the product storing means are all aligned in one straight line, so that the components are transferred only along one axis between each of these positions, a transferring and assembling robot of one-axis movable structure can be employed, thereby further simplifying the structure of the component assembling apparatus.

The apparatus for assembling components according to a fourth feature of the present invention comprises a plurality of component feeders for successively supplying a multiplicity of components to a component feeding position; an assembling base provided with an assembling jig to assemble a product; a product storing means having a multiplicity of holding recesses for holding an assembled product, each of the holding recesses being consecutively positioned at a predetermined product receiving position, and a transferring and assembling robot which takes out the component at the component feeding position of the component feeder, transfers the component to the assembling base to assemble the component into the product, and conveys the assembled product into the holding recess positioned at the product receiving position of the product storing means, or alternatively comprises a transferring and assembling robot which takes out and transfers a component into the holding recess positioned at the assembling position of the product storing means and assembles the component into the product within the holding recess, the assembling base being omitted, by which the above method of assembling components can be implemented.

BRIEF DESCRIPTION OF DRAWINGS

FIG. 16 is a plan view of a component assembling apparatus according to a fifth embodiment of the present invention.

BEST MODES FOR CARRYING OUT THE INVENTION

The component assembling apparatus according to a first embodiment of the present invention will be hereinafter described referring to FIGS. 1 to 5.

Figure 1:
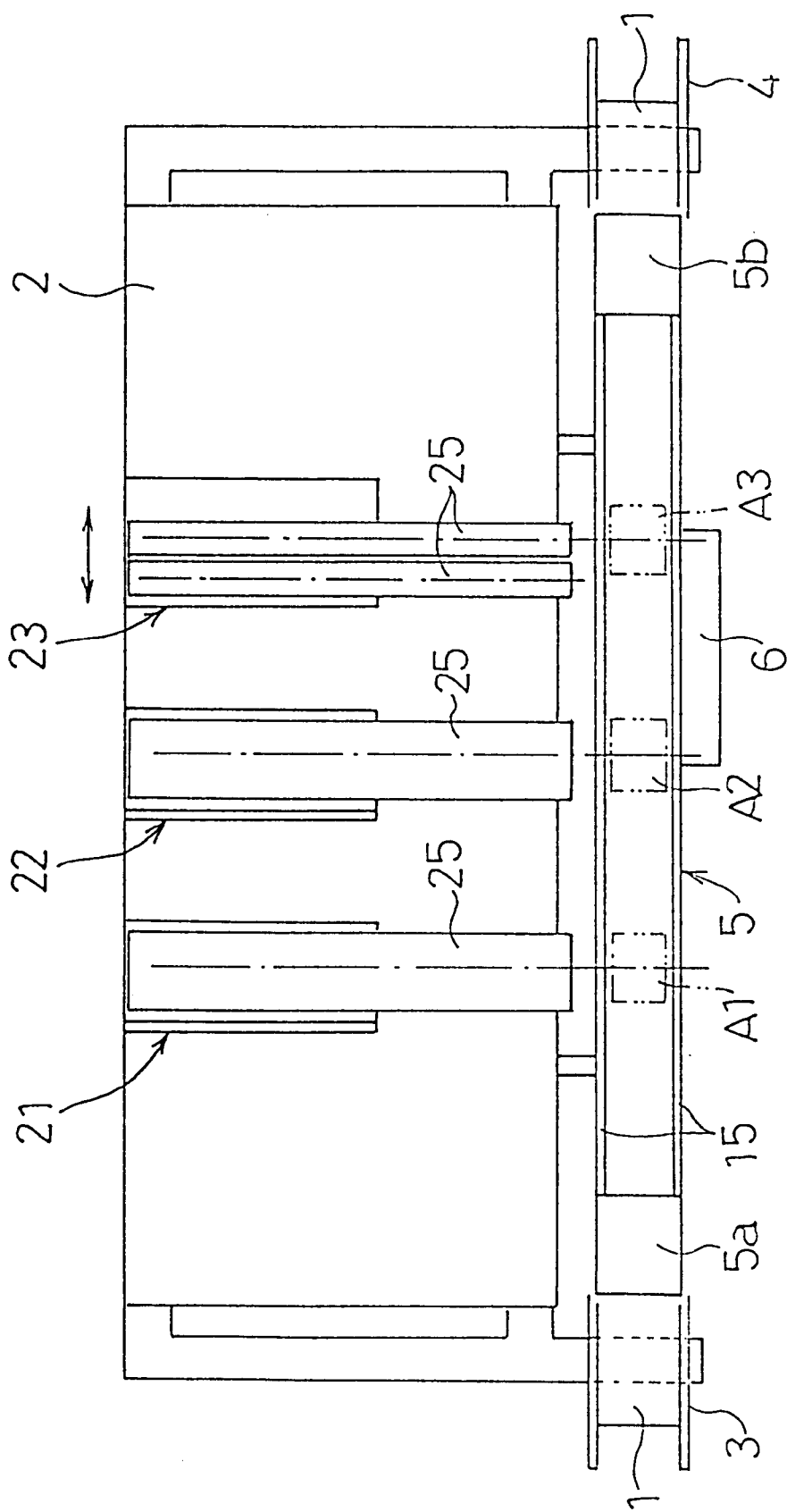
FIG. 1 is a plan view of an assembling apparatus according to a first embodiment of the present invention.
Figure 2:
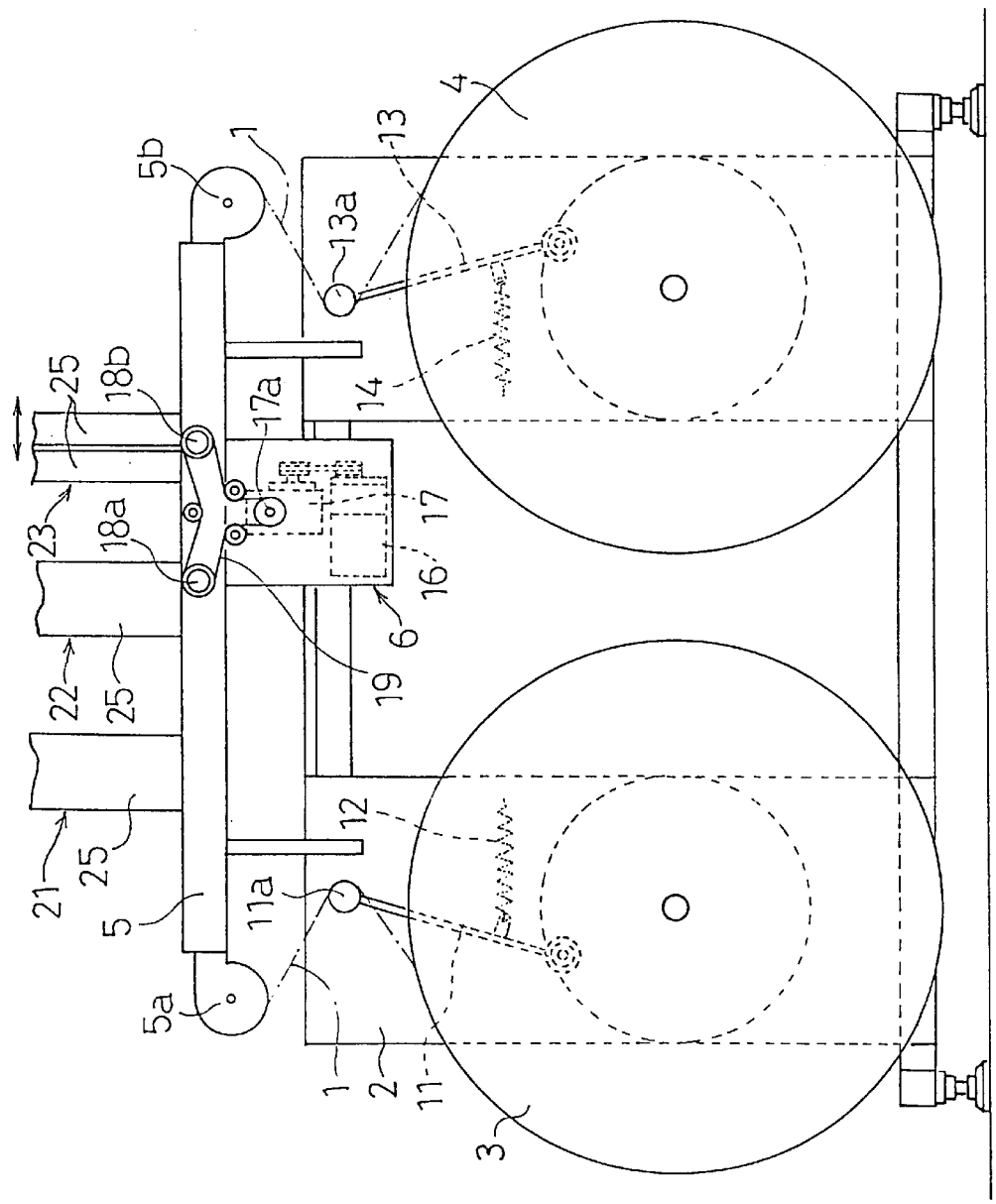
FIG. 2 is a front view of the assembling apparatus of the embodiment.

In FIGS. 1 and 2, a tape-like member 1, and a supply reel 3 and a take-up reel 4 for the tape-like member 1 are disposed in front on both sides of a table 2 of the assembling apparatus. A conveying path 5 is linearly arranged on the upper front of the table 2. The conveying path 5 allows the tape-like member 1 fed from the supply reel 3 to run therealong to the take-up reel 4. An intermittent conveying means 6 is provided on the way along the conveying path 5 for conveying the tape-like member 1 at intervals of a specific pitch.

Figure 5:
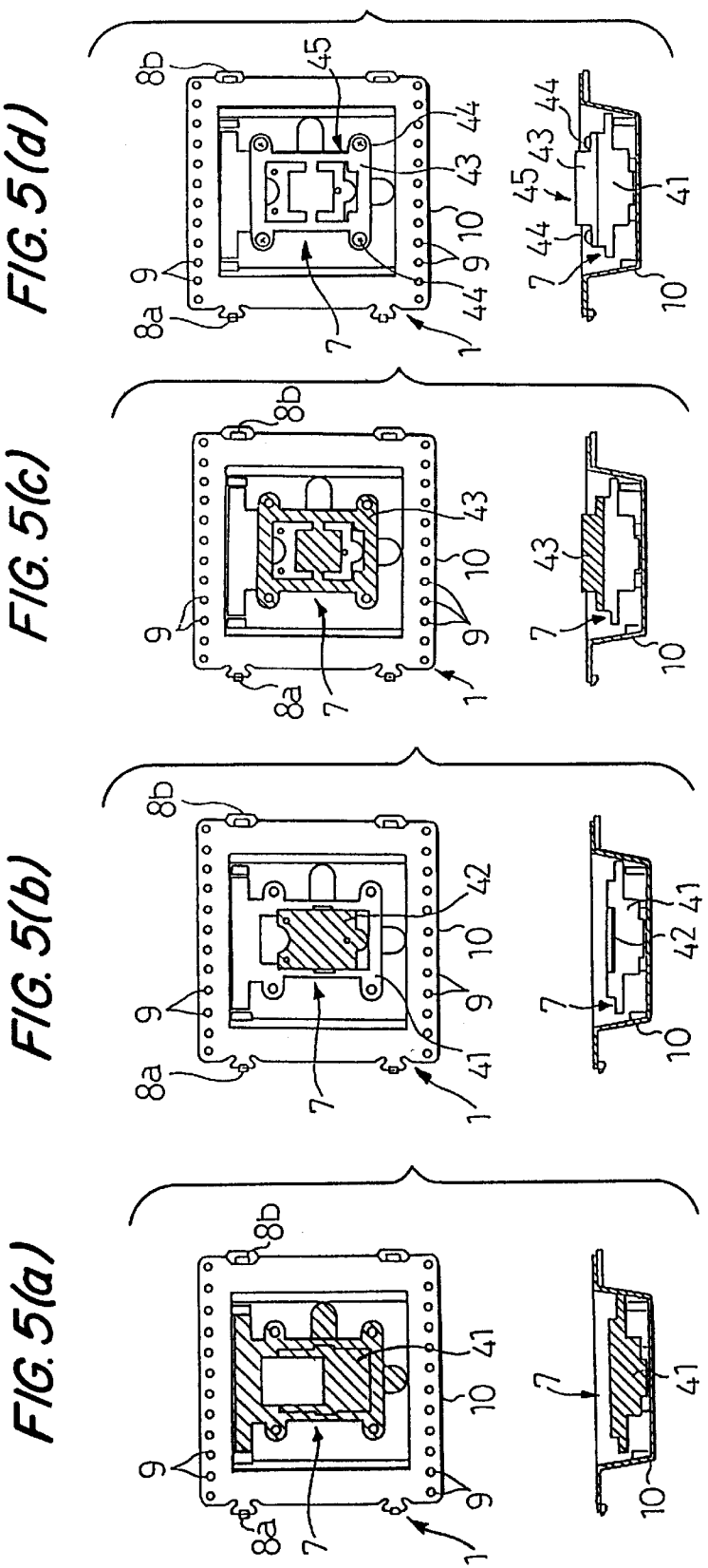
FIG. 5(a), 5(b), 5(c), and 5(d) are plan views and longitudinal sectional views showing each step of feeding and assembling components in a holding recess in the assembling apparatus of the embodiment.

The tape-like member 1 of this embodiment comprises, as shown in FIG. 5, a succession of holder units 10 joined to each other by couplers 8a and 8b at either end to form a tape-like train, each of the holder units 10 having a holding recess 7 in the center for holding a product, and feeding perforations 9 at both side edges thereof.

A guide roller 11a is mounted at the distal end of a pivotal lever 11 for feeding the tape-like member 1 drawn out from the supply reel 3 to a leading guide 5a of a circular arc shape located at one end of the conveying path 5. The pivotal lever 11 is lightly urged by a spring 12 in a direction for winding the tape-like member 1 around the supply reel 3. The tape-like member 1, upon being transferred by the intermittent conveying means 6, causes the pivotal lever 11 to swing against the pulling force of the spring 12 to a predetermined angular position, where the supply reel 3 is driven to feed a predetermined length of the tape-like member 1.

The tape-like member 1 after running through the conveying path 5 is rewound on the take-up reel 4 by the action of a discharge guide 5b of a circular arc shape located at the other end of the conveying path 5 and a guide roller 13a mounted at the distal end of a pivotal lever 13. The pivotal lever 13 is lightly urged by a spring 14 in a direction for winding the tape-like member 1 around the take-up reel 4. As the tape-like member 1 is fed by the intermittent conveying means 6, it causes the pivotal lever 13 to swing to a predetermined angular position by the pulling force of the spring 14, where the take-up reel 4 is driven to rewind a predetermined length of the tape-like member 1.

Figure 3:
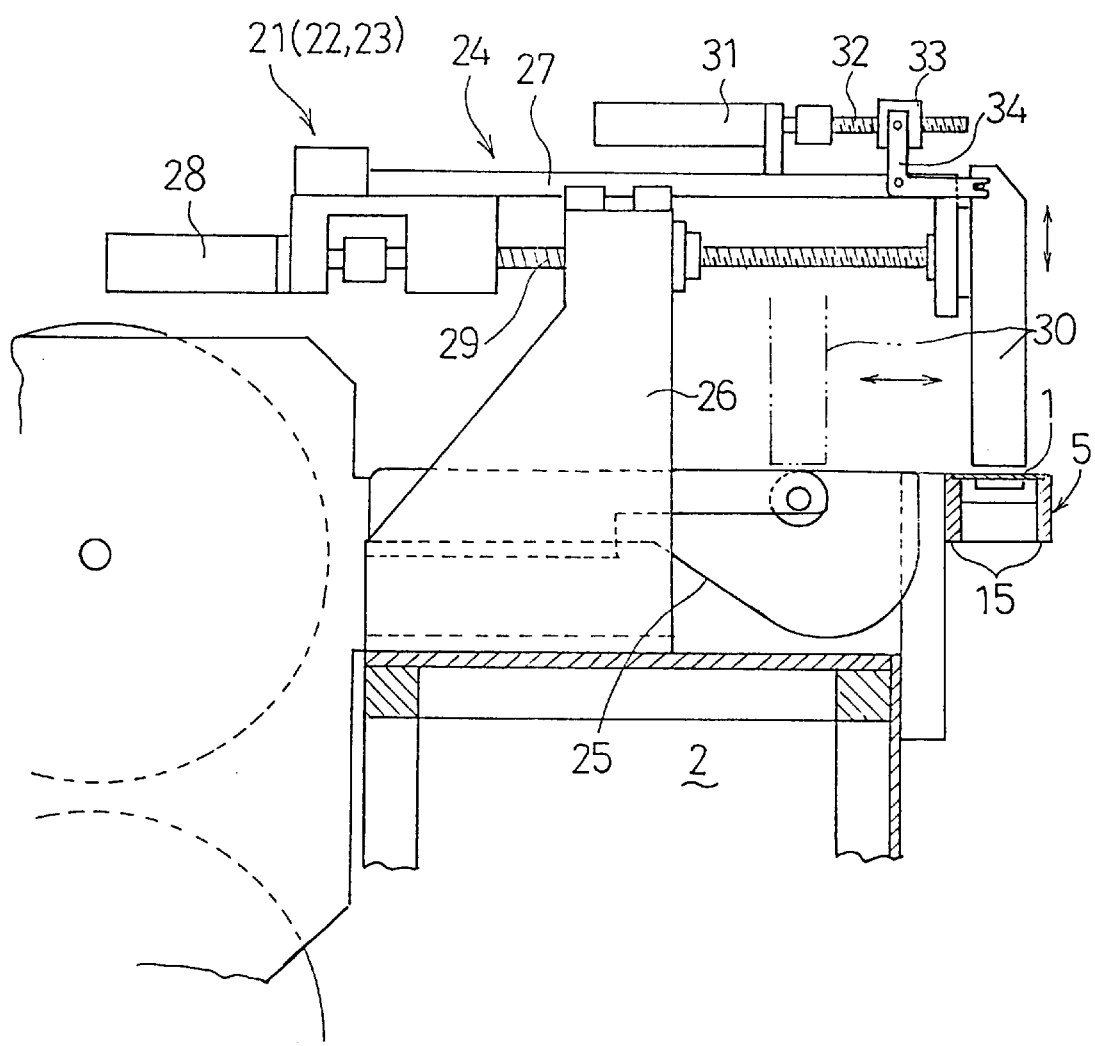
FIG. 3 is a side elevational view showing a component feeding and assembling means in the assembling apparatus of the embodiment.

The conveying path 5 comprises a pair of transfer rails 15 which supports the tape-like member 1 at both sides such as to allow free movement, as shown in FIG. 3. Referring to FIG. 2, the intermittent conveying means 6 comprises a servo motor 16, an intermittent rotation mechanism 17, and a linking means 19 for linking an output shaft 17a of the intermittent rotation mechanism 17 to a air of drive shafts 18a and 18b to which toothed wheels (not shown) are fixed for engaging with the feeding perforations 9 at both side edges of the tape-like member 1, whereby the tape-like member 1 is intermittently transferred at the same pitch as that of the distance between the two adjacent holding recesses 7.

First, second, and third assembly stations A1, A2, A3 are disposed along the conveying path 5 at locations where the holding recesses 7 of the tape-like member 1 pause during the intermittent movement by the intermittent conveying means 6. Mounted on the table 2 at each of the three assembly stations A1 to A3 are a first, second, and third component feeding and assembling means 21, 22, 23 respectively for feeding their respective components 42 to 44 (FIG. 5) into the holding recess 7 to assemble a product 45. Each of the component feeding and assembling means 21 to 23 comprises a component transferring and assembling means 24 and a component feeder 25 as shown in FIG. 3.

The component transferring and assembling means 24 comprises a moving body 27 supported by the upper end of a support bracket 26 mounted on the table 2 and linked to a lead-screw mechanism 29 driven by a servo motor 28 for movement to and from the conveying path 5, and a lifting body 30 moved upward and downward by an L-shaped lever 34 pivoted in linkage with a movable block 33, which is supported at the end of the moving body 27 on the conveying path 5 side such as to be vertically movable, and moved by a lead-screw mechanism 32 driven by a servo motor 31. A working unit (not shown) for supplying and assembling the components 42, 43, 44 as necessary in the holding recess 7 of the tape-like member 1 is mounted to the lifting body 30. The components 42 to 44 are thus taken out from the component feeder 25 and transferred to the holding recess 7 of the tape-like member 1 to be assembled therein by the two-axial movements driven by the servo motors 28 and 31.

The component feeder 25 comprises a known tape-carried component feeding means loaded with a tape-like component carrying assembly, on which a multiplicity of components are accommodated, for supplying the components in sequence to a prescribed component take-out position. The component feeder 25 is mounted to the support bracket 26 such that this component take-out position corresponds with a component pick-up location of the working unit of the component transferring and assembling means 24.

Figure 4:
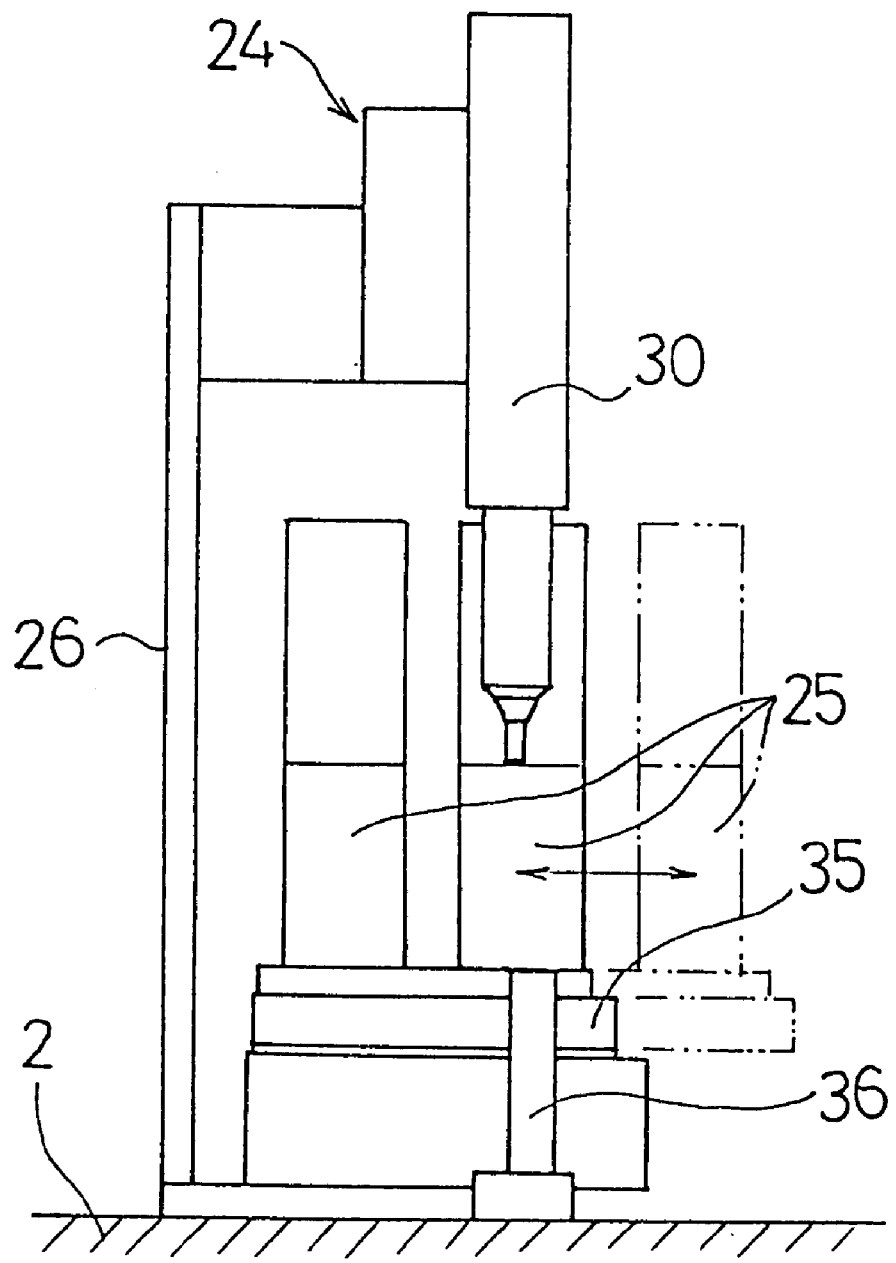
FIG. 4 is a schematic front view of the component feeding and assembling means of the embodiment.

Furthermore, in this embodiment, the component feeding and assembling means 23 located at the assembly station A3 includes a switching means 35 for selectively picking up components from a given one of a plurality of the detachable component feeders 25 and for supplying them to the single component transferring and assembling means 24 as shown in FIG. 4. Thus, when one of the component feeder 25 has run out of components, the same kind of components are supplied from other component feeder 25. This allows the component feeding and assembling means 23 to perform the assembling operation continuously without interruption while the exhausted component feeder 25 is replaced by new one. In FIG. 4, the numeral 36 represents a mechanism for conveying the component feeder 25.

As one example, the assembling operation for assembling a product 45 shown in FIG. 5 in the holding recesses 7 of the tape-like member 1 by the assembling apparatus with the above construction will be explained. The tape-like member 1 is first drawn out from the supply reel 3, passed through the conveying path 5, wound on the take-up reel 4, and intermittently conveyed by the intermittent conveying means 6. It is provided that each holding recess 7 of the tape-like member 1 on the supply reel 3 preliminarily carries a product base 41 which is a basic member of the product 45, as shown in FIG. 5(a).

When the tape-like member 1 is intermittently conveyed by the intermittent conveying means 6 and its holding recess 7 carrying the product base 41 pauses at the first assembly station A1, the component feeding and assembling means 21 supplies and mounts the first component 42 onto the product base 41 in the holding recess 7 as shown in FIG. 5(b).

Then, when the holding recess 7 arrives and pauses at the second assembly station A2, the second component 43 is fed into the holding recess 7 by the component feeding and assembling means 22 and assembled to the base component 41 to which the first component 42 has been mounted, as shown in FIG. 5(c).

Next, when the holding recess 7 arrives and pauses at the third assembly station A3, the third components 44 (specifically, screws) are fed into the holding recess 7 by the component feeding and assembling means 23 so that the second component 43 is fixedly fastened to the product base 41 by the third component 44 with the first component 42 being mounted inside, thereby assemblage of the product 45 is accomplished in the holding recess 7, as shown in FIG. 5(d). After that, the tape-like member 1 carrying a row of products 45 in their respective holding recesses 7 is rewound on the take-up reel 4 before being conveyed to the following step.

In this embodiment, since the third components (screws) 44 supplied from the component feeder 25 are small but needed in a great amount, a plurality of component feeders 25 are provided in the component feeding and assembling means 23 at the third assembly station A3 and switched from one to another by the switching means 35 so that continuous assembling operation can be performed with the single component transferring and assembling means 24. It is of course possible to employ similar arrangement in any of the assembly stations A1 to A3.

As set forth above, according to this embodiment, the components 42 to 44 are respectively fed into each of the holding recesses 7 of the tape-like member 1 at each stopping position of the plurality of holding recesses 7 while the tape-like member 1 is intermittently conveyed at the pitch corresponding to the arranged intervals of the holding recesses 7, by which the assemblage of the product 45 can be accomplished within each of the holding recesses. This allows the tape-like member 1 to serve both as an assembly medium and as a delivery medium for feeding the products 45 to the succeeding step. As a result, the number of assembling devices and of the assembling steps will be reduced, remarkably decreasing the overall cost of assembly.

In this embodiment described above, the component feeder 25 is constituted with a tape-like component feeding means. It is also possible to employ a tray-type component feeder or parts feeder type component feeder which transfers a multiple of components by means of vibration in place of or in addition to the tape-like component feeding means as the component feeder 25.

Next, the component assembling apparatus according to a second embodiment of the present invention will be described referring to FIGS. 6 to 13.

Figure 6:
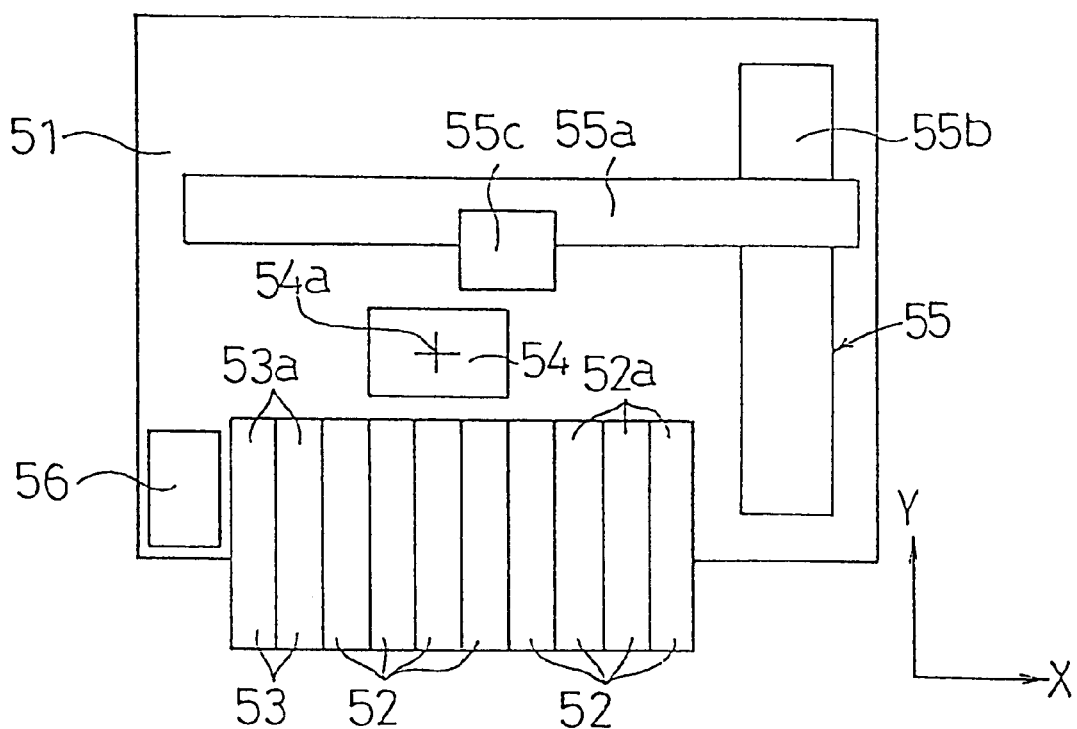
FIG. 6 is a plan view showing a schematic construction of an assembling apparatus according to a second embodiment of the present invention.

In FIG. 6, numeral 51 represents a table of the component assembling apparatus, on which at its front part a plurality of tape-like component feeders 52 and one or more product storing means 53 are disposed in parallel such that their respective component feeding positions 52a and product receiving positions 53a are aligned in a straight line. An assembling base 54 is located behind and substantially in the center of the straight line along which the component feeding positions 52a of the tape-like component feeders 52 and the product receiving positions 53a of the tape-like product storing means 53 are aligned. Also, a transferring and assembling robot 55 which transfers components and products between the component feeding positions 52a, the product receiving positions 53a, and the assembling base 54 and performs necessary assembling actions is mounted on the table 51. The transferring and assembling robot 55 includes a moving body 55c which is movable in two directions of X and Y in a horizontal plane by an X-axis stage 55a and Y-axis stage 55b. The moving body 55c is equipped with a transferring and assembling head (not shown) which is vertically movable. In addition, a tool changer 56 is mounted on the table 51 for exchanging and mounting tools appropriately in accordance with type of product to be assembled on the transferring and assembling head.

Figure 7:
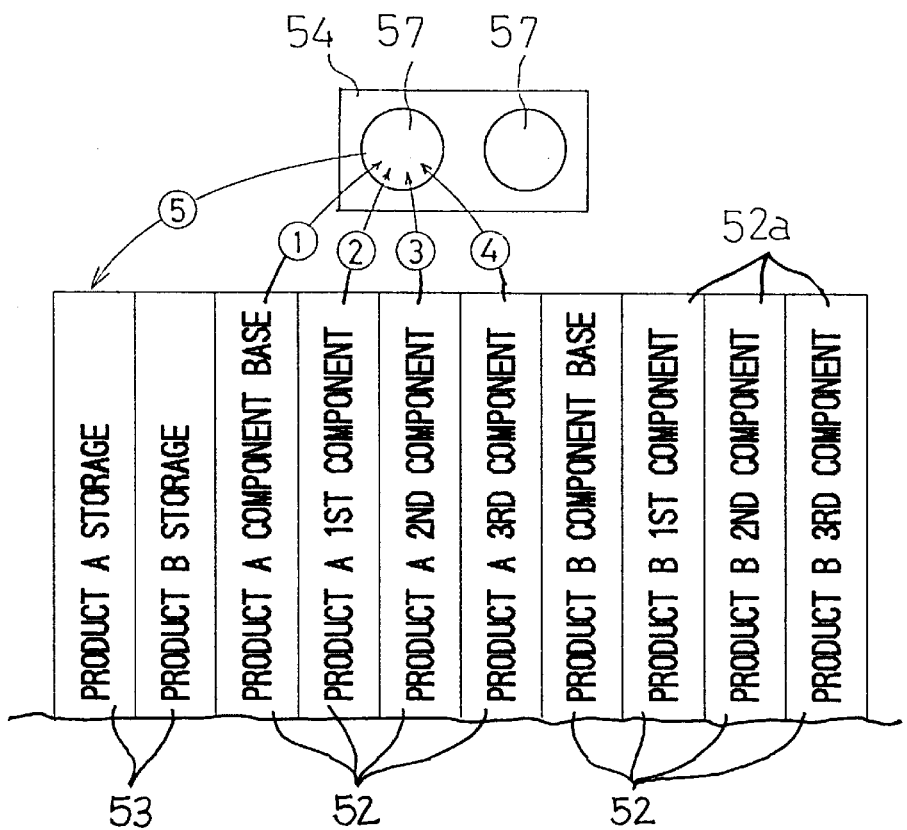
FIG. 7 is an explanatory view showing actions of the assembling apparatus in the embodiment.

In the illustrated example as shown in FIG. 7, two product storing means 53 are provided for storage of two different kinds of products A and B, and a total amount of eight tape-like component feeders 52 respectively accommodating each type of components are provided for assembling respective product bases and first to third components into each type of products A, B. The assembling base 54 includes two assembling jigs 57 for the products A and B.

Figure 8:
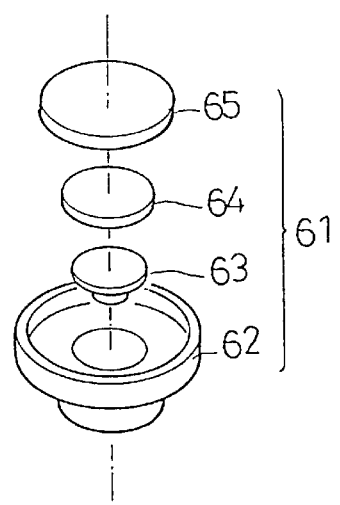
FIG. 8 is an exploded perspective view of a product in the embodiment.
Figure 9:
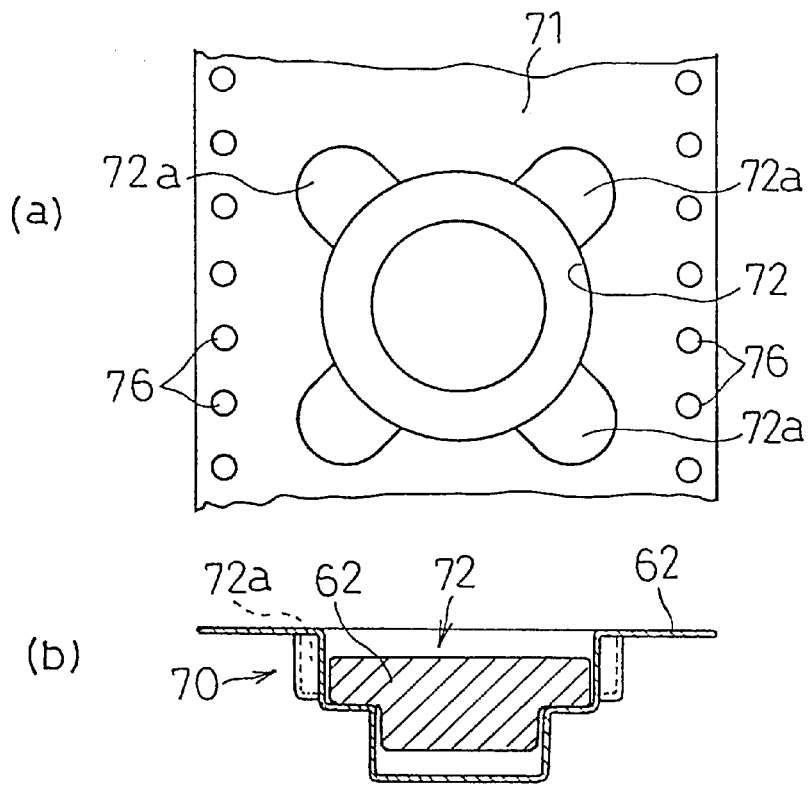
FIG. 9 shows a component carrying assembly of a base component in the embodiment; (a) is a plan view of a tape-like member which holds the component and (b) is a longitudinal sectional view in which the component is accommodated in the tape-like member.
Figure 10:
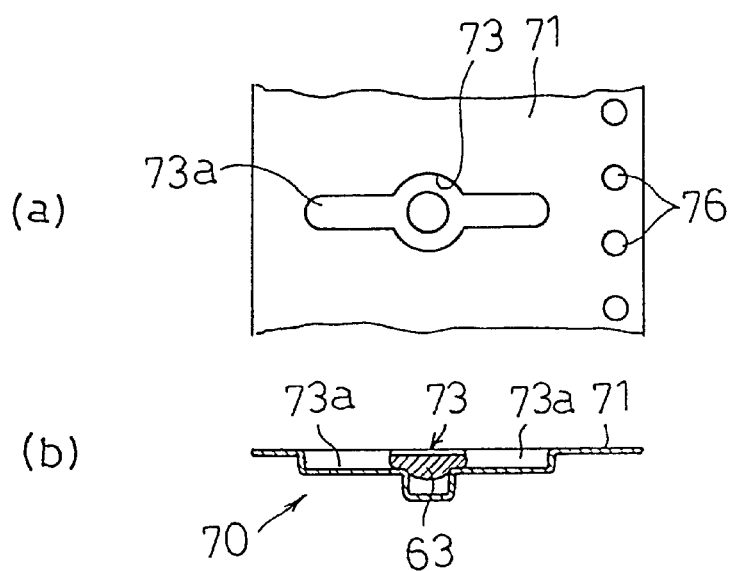
FIG. 10 shows a component carrying assembly of a first component in the embodiment; (a) is a plan view of a tape-like member which holds the component and (b) is a longitudinal sectional view in which the component is accommodated in the tape-like member.
Figure 11:
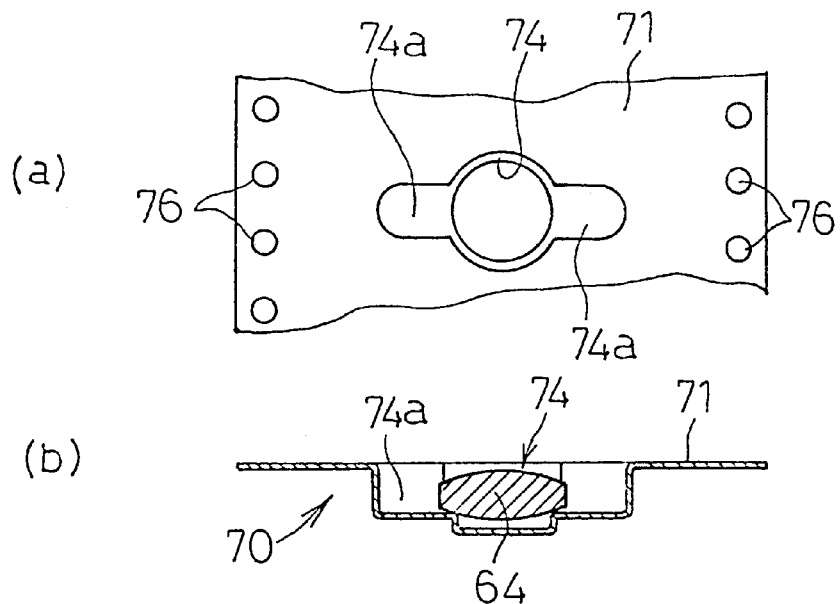
FIG. 11 shows a component carrying assembly of a second component in the embodiment; (a) is a plan view of a tape-like member which holds the component and (b) is a longitudinal sectional in which the component is accommodated in the tape-like member.
Figure 12:
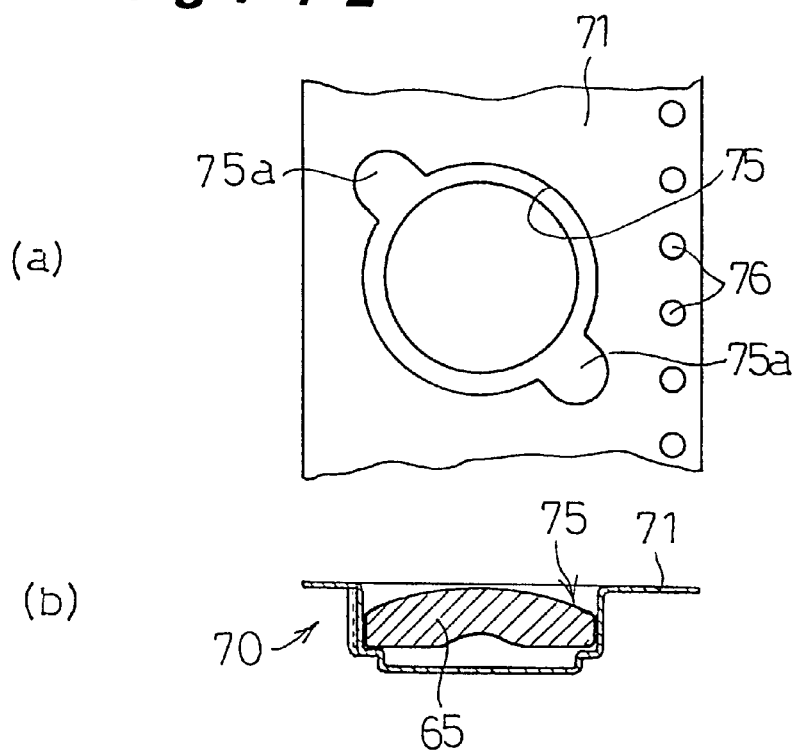
FIG. 12 shows a component carrying assembly of a third component in the embodiment; (a) is a plan view of a tape-like member which holds the component and (b) is a longitudinal sectional view in which the component is accommodated in the tape-like member.

An example of the product A is illustrated in FIG. 8. The product A is a lens tube 61 comprising a first, second, and third lenses 63, 64, 65 mounted in a lens tube body 62. The lens tube body 62 and the three lenses 63 to 65 are supplied from a tape-like component carrying assembly 70 of the tape-like component feeder 52. As shown in FIGS. 9 to 12, the tape-like component carrying assembly 70 comprises a tape-like member 71 having a row of component holding recesses 72, 73, 74, and 75 provided therein at regular intervals of a pitch for accommodating the components 62, 63, 64, and 65 and a row of feeding perforations 76 with a proper pitch at one or both edges of the tape-like member 71. Furthermore, pick-up notches 72a to 75a are provided at positions in the peripheral walls of the corresponding component holding recesses 72 to 75 for ease of chucking their corresponding components 62 to 65. The tape-like member in the product storing means 53 for holding the lens tubes 61 as the product A is substantially identical to the tape-like member 71 shown in FIG. 9 where the component holding recess 72 serves as a recess for receiving the product A.

Figure 13:
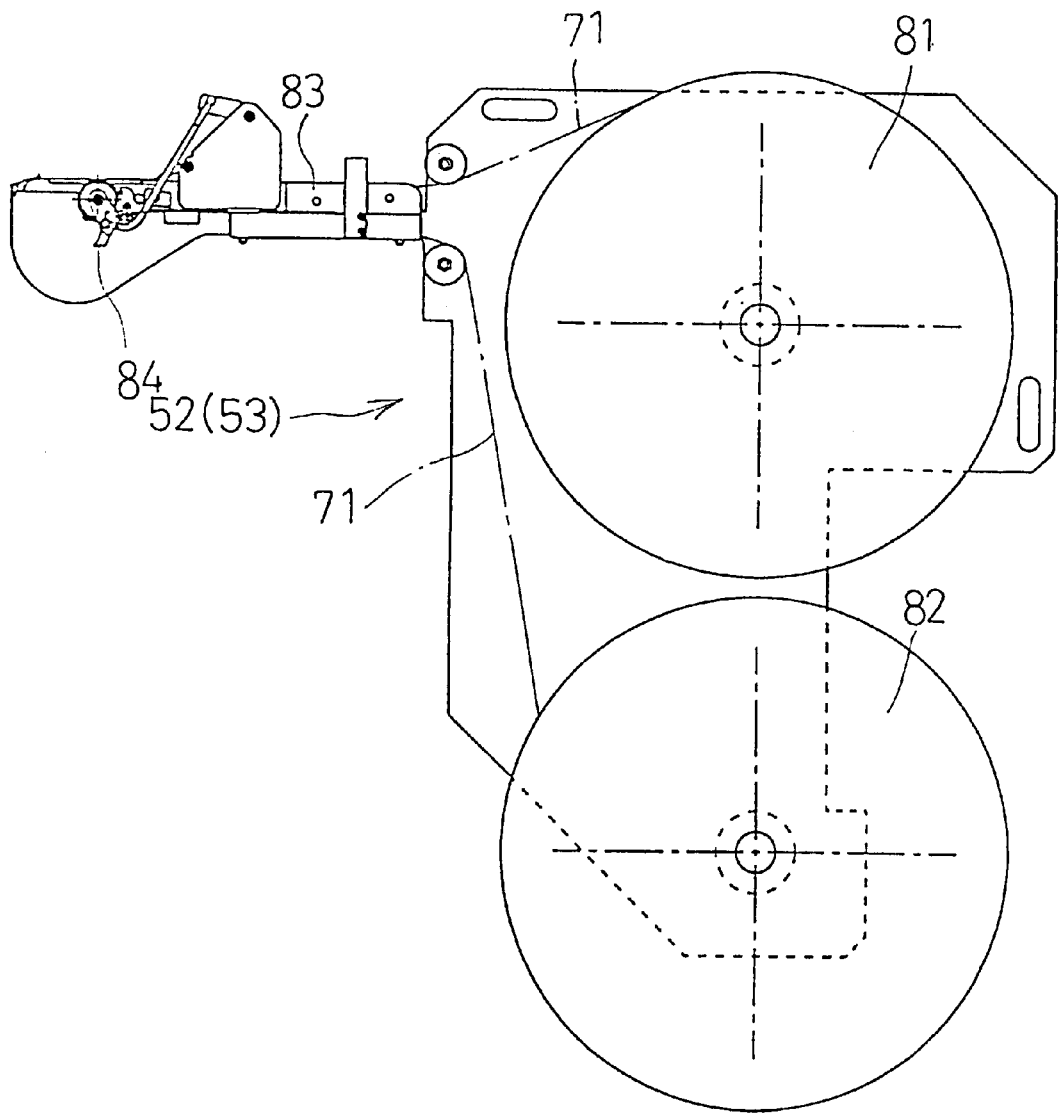
FIG. 13 is a front view showing a tape-like component feeding means and a product storing means in the embodiment.

The tape-like component feeder 52 loaded with the tape-like component carrying assembly 70 and the product storing means 53 with the tape-like member 71 for holding the lens tube 61 or the product are constructed such that, as shown in FIG. 13, a supply reel 81 around which the tape-like member 71 is wound and a take-up reel 82 are both located behind. The tape-like member 71 drawn out from the supply reel 81 is passed through a conveying path 83 so that the component holding recesses 72 to 75 or the product receiving recesses are successively positioned to the component feeding position 52a or the product receiving position 53a, where the components 62 to 65 are taken out or the product 61 is received. Then, by operating a feed lever 84, the tape-like member 71 is intermittently transferred at the arranged intervals of the component holding recesses 72 or the product receiving recesses, and the tape-like member 71 after the components 62–65 have been taken out therefrom or the product 61 has been received therein is inverted downwards at the distal end of the conveying path 83 and passed beneath the conveying path 83 before being taken up on the take-up reel 82.

The action of the assembling apparatus with the above construction for assembling the lens tube 61 or the product A as held in the tape-like member 71 is now explained referring to FIG. 7. In Step 1 of the procedure, the lens tube body 62 is taken out from the tape-like component feeder 52 which accommodates lens tube bodies 62 and transferred to the assembling jig 57 of the assembling base 54 by the transferring and assembling robot 55. At Step 2, the first lens 63 is taken out from the tape-like component feeder 52 which accommodates first lenses 63 and mounted into the lens tube body 62 placed in the assembling jig 57 of the assembling base 54 by the transferring and assembling robot 55. This is followed by similar Steps 3 and 4, where the second and the third lenses 64, 65 are mounted into the lens tube body 62 to complete the lens tube 61. Then, at Step 5, the lens tube 61 assembled in the assembling jig 57 is taken out by the transferring and assembling robot 55 and transferred to the product receiving recess in the tape-like member 71 positioned at the product receiving position 53a of the product storing means 53 to be held therein.

By repeating the above assembling actions, the assembled products are successively transferred to their respective product receiving recesses of the tape-like member 71 mounted on the product storing means 53, by which the products can be fed to the next step in a state held on the tape-like member 71.

In the above description of the tape-like component feeder 52, one example has been shown as illustrated in FIG. 13 in which the tape-like member 71 is recovered by taking it up on the take-up reel 82. However, other type of tape-like component feeder may be also employed, which is constructed such as to cut and dispose the tape-like member 71 after taking out the components.

Also, although the example has been shown in which the product storing means 53 is provided in addition to the tape-like component feeder 52 accommodating the lens tubes 62 in the above embodiment, in the case where the tape-like component feeder 52 of such construction as shown in FIG. 13 is employed, the lens tube 61 which has been assembled from the lens tube body 62 in the assembling jig 57 may be transferred back to the tape-like component feeder 52, where the lens tube body 62 has been accommodated.

Figure 14:
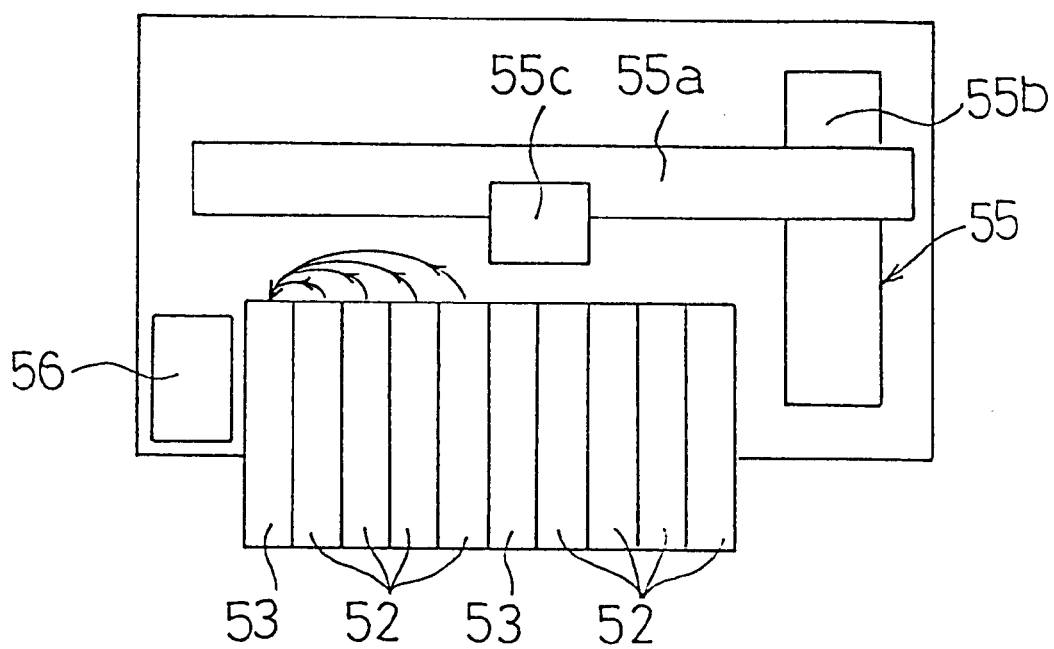
FIG. 14 is a plan view showing a schematic arrangement of a component assembling apparatus according to a third embodiment of the present invention.

The third embodiment of the present invention will be described referring to FIG. 14. Like parts are given like numerals as those described in the second embodiment, and will be explained in no more detail but only different points. As compared with the second embodiment, in which the lens tube 62, first, second, and third lenses 63, 64, 65 are assembled together on the assembling base 54, this embodiment omits the assembling base 54 and allows the lens tube 62 and first, second, and third lenses 63, 64, 65 to be transferred, assembled together, and held in the product receiving recess of the tape-like member 71 in the product receiving means 53.

According to the third embodiment, if the tape-like member 71 is constructed such that its product receiving recesses are accurately designed and physically strong enough to resist external stresses, it will simplify the structure of the apparatus and reduce the number of transfer steps, by which further reduction of the assembling cost can be realized.

In this embodiment, too, it is not always necessary to provide the product storing means 53 in addition to the tape-like component feeder 52 accommodating the lens tube bodies 62, and instead the lens tube (product) 61 may be assembled and held in the component holding recess 72 of the tape-like component carrying assembly 70 in the tape-like component feeder 52 where the lens tube body 62 has been accommodated.

Figure 15:
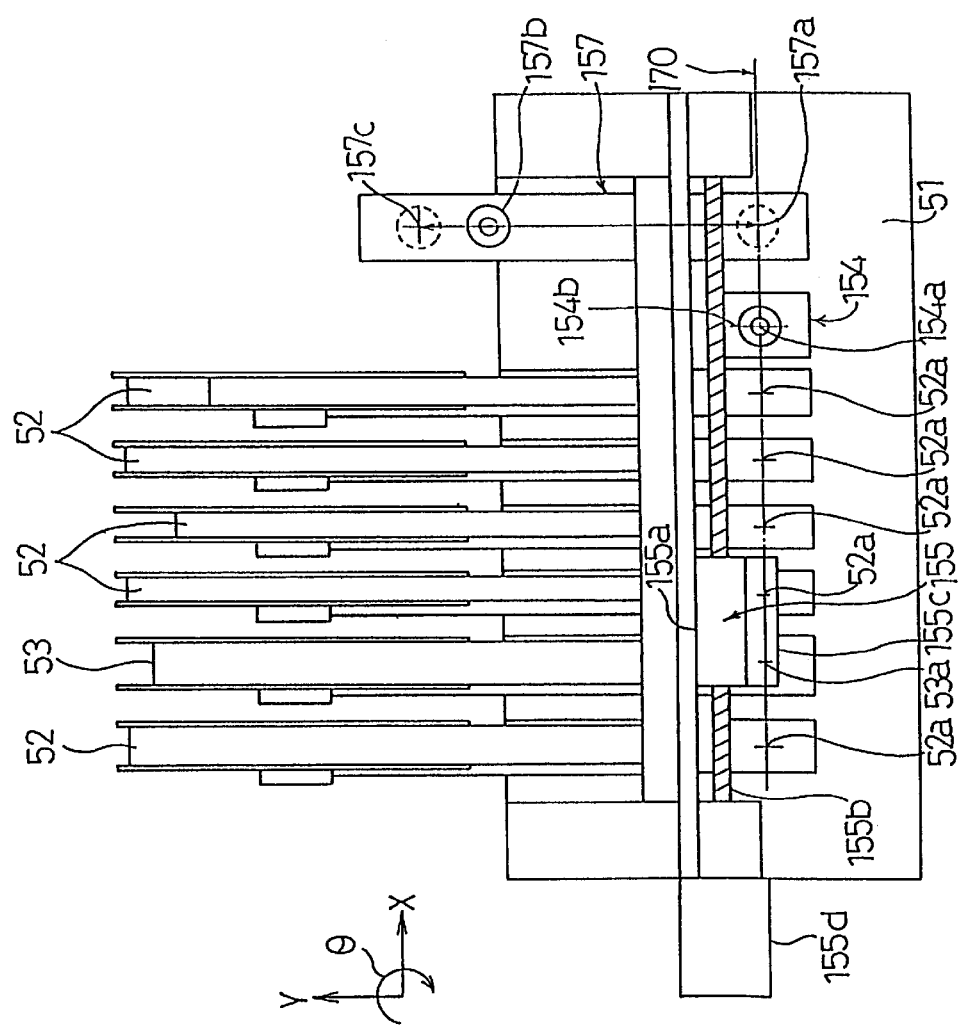
FIG. 15 is a plan view of a component assembling apparatus according to a fourth embodiment of the present invention.

Next, a fourth embodiment of the present invention will be described referring to FIG. 15. On the table 51 of the assembling apparatus are disposed a plurality of tape-like component feeders 52, a tape-like product storing means 53, a first assembling base 154, a second assembling base 157, and a transferring and assembling robot 155.

The tape-like component feeders 52 and the tape-like product storing means 53 are arranged in parallel such that their respective component feeding positions 52a and product receiving position 53a are aligned in an identical line 170. Also, an assembling position 154a of the first assembling base 154 and an assembling position 157a of the second assembling base 157 are positioned on the same line 170.

The transferring and assembling robot 155 normally receives components from each of the tape-like component feeders 52 at their respective component feeding positions 52a in sequence, transfers them to the assembling position 154a of the first assembling base 154 for assembling them into a product, and transfers the assembled product to a corresponding product receiving recess located at the product receiving position 53a of the product storing means 53. However, in the case where more complex steps are required for product assembly, the transferring and assembling robot 155 only transfers the components in sequence to the assembling position 157a of the second assembling base 157 and allows an assembling device 157c of the second assembling base 157 to assemble the component together. For that purpose, the second assembling base 157 is equipped with a stage robot 157b which receives the components at the assembling position 157a, and successively transfers them to the assembling device 157c. The assembled product is then returned to the assembling position 157a. The assembling device 157c is designed for carrying out an intricate assembling operation such as ultrasonic welding, laser joining, or soldering. The product is transferred by the transferring and assembling robot 155 from the assembling position 157a of the second assembling base 157 to a corresponding product receiving recess located at the product receiving position 53a of the tape-like product storing means 53.

As described above, since the component feeding position 52a, the product receiving position 53a, and the two assembling positions 154a and 157a are aligned on the identical line 170, the transferring and assembling robot 155 needs to be movable only along one direction, e.g., in the X-axis direction. Therefore, the moving body 155a of the transferring and assembling robot 155 is moved only along the X-axis direction by an X-axis ball-screw 155b which is driven by a servo motor 155d. Further, the transferring and assembling robot 155 has a transferring and assembling section 155c being arranged vertically movable with respect to the moving body 155a.

As a result of constructing the transferring and assembling robot 155 to be movable only in one direction as described above, the structure of the component assembling apparatus is simplified and the overall cost of production will be reduced. In addition, as shown in FIG. 15, the first assembling base 154 is equipped with a stage robot 154b with which the position of each component can be adjusted along the Y-axis direction and the orientation of the component can be adjusted in a horizontal rotating direction (θ), so that the position of the component can be adjusted in the X, Y, and θ directions for precise assemblage of the product (the adjustment along the X-axis direction is controlled with the transferring and assembling robot 155). For similar purposes, the second assembling base 157 is equipped with a stage robot 157b by which the position of the component can be adjusted in the Y-axis direction and the orientation of the component can be adjusted in the θ direction.

In this embodiment, too, a particular one of the component feeders 52 may serve as the product storing means 53, in which case it is preferable to construct such that base components are accommodated in that particular component feeder 52. Also, one of the first and second assembling bases 154, 157 may be omitted. It is also possible to omit both assembling bases 154 and 157, and to assemble the components into a product in a corresponding product receiving recess in the product storing means 53.

Next, a fifth embodiment of the present invention will be described referring to FIG. 16. On the table 51 of the assembling apparatus are disposed a plurality of tape-like component feeders 52, a tray type product storing means 153 which also serves as a component feeding means, a transferring and assembling robot 155, and an assembling base 154.

The component feeding positions 52a of the tape-like component feeders 52, the product receiving (or component feeding) position 153a of the tray type product storing means 153, the assembling position 154a of the assembling base 154 are positioned in alignment on an identical line 170. The transferring and assembling robot 155 comprises the moving body 155a which moves only along the X-axis direction, and the transferring and assembling section 155c which moves upward and downward, and is constructed substantially the same as that of the fourth embodiment.

The tray type product storing means 153 which serves as the component feeding means as mentioned above has a multiplicity of holding recesses 180 formed in a tray 153c in a matrix along the X and Y axes directions for holding base components of the products therein. The tray type product storing means 153 feeds the tray 153c onto the line 170 by a tray feeder 153c. Positioning along the Y axis direction is accomplished by this tray feeding operation, while the positioning along the X axis direction is performed by the transfer and assembling robot 155, by which one of the holding recesses 180 is positioned at the component feeding (or product receiving) position 52a. The base component is taken out by the transferring and assembling robot 155 from the holding recess 180 located at the component feeding (and product receiving) position 52a and transferred to the assembling position 154a of the assembling base 154. Successively, the transferring and assembling robot 155 transfers the components from their respective tape-like component feeders 52 to the assembling position 154a and assembles them into the products. The assembled product is returned by the transferring and assembling robot 155 to the corresponding holding recess 180 of the tray type product storing means 153 located at the product receiving position 153a.

In this embodiment, too, the assembling base 154 may be omitted and the components may be assembled together within the holding recess 180 of the tray type product storing means 153. Suffice to say, the tray type product storing means 153 may be used only for the purpose of storing the assembled products.

The present invention is not limited to the prescribed embodiments but may be embodied in a variety of other forms. For example, the component feeders 52 described in the first to fifth embodiments are constructed with a tape-like component feeding means loaded with a multiplicity of components held on a tape-like member. In place of or in addition to that, a tray type component feeding means loaded with a multiplicity of components arranged in trays and/or parts feeder type component feeding means which conveys a multiplicity of components by means of vibration may also be employed.

As set forth above, the present invention is applicable to a component assembling method and component assembling apparatus for assembling a variety of components into a product. For example, the present invention may be applied for assembling a lens tube from the components such as a lens tube body and a plurality of lenses.

What is claimed is:

1. A method of assembling components comprising the steps of:

intermittently transferring a tape-like member provided with a multiplicity of holding recesses extending below a surface of the tape-like member which are capable of respectively holding an assembled product therein; supplying a component consecutively to each of the holding recesses at each stopping position thereof, whereby the component is assembled into the product within each of the holding recesses; and keeping the assembled product to be held in each of the holding recesses.

2. The method of assembling components according to claim 1 wherein a base component which constitutes a base member of the product is preliminarily held in each of the holding recesses on the tape-like member.

3. A method of assembling components comprising the steps of:

taking out a component successively from a plurality of component feeders which supply a multiplicity of components to a component feeding position in succession; transferring the component consecutively into each of a multiplicity of holding recesses formed in a product storing means, each holding recess being positioned at an assembling station; assembling the component into a product within each of the holding recesses; and keeping the assembled product to be held in each of the holding recesses of the component storing means.

4. A method of moving and assembling a product from a plurality of individual components that are combined together to form the product comprising the steps of:

providing an interconnected sequence of holder units that are wound about a supply reel, each holder unit is pivotally connected to an adjacent holder unit and has an upper peripheral surface and an open lower recess for supporting components;

providing a conveying path for guiding the holder units sequentially past a plurality of assembly stations for dispensing respective components onto the holder units;

providing a take up reel for storing the interconnected sequences of holder units after translating past the plurality of assembly stations;

feeding the holder units from the supply reel to the conveying path;

driving the holder units to provide a predetermined pitch space to coordinate with load positions of the assembly stations;

assembling a respective component from each participating assembly station by mounting it at a location above a bottom of the holder unit recess whereby the product is sequentially assembled within the holder unit recess;

removing the assembled product from the holder unit; and storing the holder units by winding them on the take up reel.

5. The method of claim 4 further including providing a base component in each holder unit lower recess as it is wound on the supply reel.

6. The method of claim 5 further including providing a first predetermined amount of tension to the sequence of holder units as the holder units are unwound from the supply reel.

7. The method of claim 6 further including providing a second predetermined amount of tension to the sequence of holder units as the holder units are wound onto the take up reel.

8. A method of assembling components into an assembled product comprising the steps of:

(a) providing a tape carrier having a plurality of spaced holding recesses of sufficient depth to respectively hold in each holding recess an assembled product;

(b) providing a first component of the assembled product in each holding recess;

(c) adding a second component to the first component within the holding recess at a first assembling station;

(d) advancing the tape carrier to a position adjacent a subsequent assembling station;

(e) adding another component to the intermediate product within the holding recess at the subsequent assembling station; and (f) repeating steps (d) and (e) until an assembled product is completed.

9. A method of assembling components supplied from a plurality of component feeders into an assembled product comprising the steps of:

(a) providing a product carrying holder with a plurality of recesses that translates pass the plurality of component feeders;

(b) positioning components from an initial component feeder to respectively the plurality of recesses;

(c) moving the product carrying holder to an assembling station;

(d) providing another component from the plurality of component feeders to the assembling station and combining it with the initial component within each of the holder recesses to form an intermediate product;

(e) moving the product carrying holder to subsequent assembling stations and repeating step (d) until the assembled product is completed.

10. The method of assembling components according to claim 9 wherein the plurality of component feeders are tape-like component feeding units which contain a multiplicity of components held on a tape-like member.

11. The method of assembling components according to claim 10 wherein the plurality of component feeders comprise tray type component feeding units which hold a multiplicity of components aligned on a tray and/or a parts feeder type component feeding unit which conveys a multiplicity of components by vibration in addition to the tape-like component feeding unit which holds a multiplicity of components on a tape-like member.

12. The method of assembling components according to claim 11 wherein the product carrying holder translates along a straight axis past the component feeders.

13. The method of assemblying components according to claim 9 wherein a base component which constitutes a base member of the assembled product is preliminarily loaded in each of the holding recesses.

14. The method of assembling components according to claim 9 wherein a component is received from a component feeder at an assembling station and assembled into a product at another position, and the assembled product is returned to the assembling station, from which the assembled product is conveyed to the product carrying holder.

15. The method of assembling components according to claim 9 further including storing the assembled products in the respective plurality of recesses and winding the product carrying holder on a reel with the assembled products.

16. A method of moving and assembling a product from a plurality of individual components that are combined together to form the product comprising the steps of:

- providing an interconnected sequence of holder units that are wound about a supply reel, each holder unit is pivotally connected to an adjacent holder unit and has an upper peripheral surface and an open lower recess for supporting components;
- providing a conveying path for guiding the holder units sequentially past a plurality of assembling stations for dispensing respective components onto the holder units;
- providing a take up reel for storing the interconnected sequences of holder units after translating past the plurality of assembling stations;
- feeding the holder units from the supply reel to the conveying path;
- driving the holder units to provide a predetermined pitch space to coordinate with load positions of the assembling stations;
- assembling a respective component from each participating assembling station by mounting it at a location above a bottom of the holder unit recess whereby the product is sequentially assembled within the holder unit recess;
- storing the assembled product in a holder unit; and
- storing the holder units by winding them on the take up reel.

17. The method of claim 16 further including providing a base component in each holder unit lower recess as it is wound on the supply reel.

18. The method of claim 17 further including providing a first predetermined amount of tension to the sequence of holder units as the holder units are unwound from the supply reel.

19. The method of claim 18 further including providing a second predetermined amount of tension to the sequence of holder units as the holder units are wound onto the take up reel.

* * * * *